United States Patent [19]

Babanezhad

[11] Patent Number: 6,069,505
[45] Date of Patent: May 30, 2000

[54] DIGITALLY CONTROLLED TUNER CIRCUIT

[75] Inventor: Joseph N. Babanezhad, Cupertino, Calif.

[73] Assignee: Plato Labs, Inc., Campbell, Calif.

[21] Appl. No.: 09/044,632

[22] Filed: Mar. 19, 1998

Related U.S. Application Data

[60] Provisional application No. 60/041,181, Mar. 21, 1997.

[51] Int. Cl.$^7$ .................................................... H03K 5/00
[52] U.S. Cl. .......................... 327/156; 327/147; 327/553; 327/558; 331/1 A
[58] Field of Search ................................... 327/156, 552, 327/553, 151, 147, 160, 554, 101; 331/57, 1 A, 117 R, 17

[56] References Cited

U.S. PATENT DOCUMENTS

| | | | |
|---|---|---|---|
| 4,959,618 | 9/1990 | Shier | 327/157 |
| 5,006,733 | 4/1991 | Brown | 307/521 |
| 5,021,681 | 6/1991 | Colbeck et al. | 307/261 |
| 5,063,309 | 11/1991 | Yamasaki | 307/521 |
| 5,117,205 | 5/1992 | Nauta | 331/117 R |
| 5,121,085 | 6/1992 | Brown | 331/17 |
| 5,281,931 | 1/1994 | Bailey et al. | 333/17.1 |
| 5,422,603 | 6/1995 | Soyuer | 331/1 A |
| 5,530,399 | 6/1996 | Chambers et al. | 327/561 |
| 5,532,636 | 7/1996 | Mar et al. | 327/157 |
| 5,592,120 | 1/1997 | Palmet et al. | 327/536 |
| 5,629,650 | 5/1997 | Gersbach et al. | 327/157 |
| 5,736,880 | 4/1998 | Bruccoleri et al. | 327/157 |
| 5,767,713 | 6/1998 | Williams | 327/156 |

OTHER PUBLICATIONS

IEEE International Solid State Circuits Conference, Feb. 1996, *Digest of Technical Papers*, pp. 196–197.
*IEEE Journal of Solid State Circuits*, vol. SC–26, Dec. 1991, pp. 1988–1997.
"Monolithic Phase–Locked Loops and Clock Recovery Circuits," edited by Behzad Razavi, IEEE Press, 1996, p. and pp. 1 28–29.
*IEEE Journal of Solid State Circuits*, vol. SC–30, No. 11, Nov. 1995, pp. 1259–1266.
*IEEE Journal of Solid State Circuits*, vol. 28, No. 28, Dec. 1993, pp. 1254–1264.

*Primary Examiner*—Dinh T. Le
*Attorney, Agent, or Firm*—Townsend and Townsend and Crew LLP

[57] ABSTRACT

A digitally controlled tuner circuit for continuous-time filters. Active RC integrators include digitally programmable feedback capacitors to allow for digital fine tuning of their time constant. The PLL-based tuner circuit includes a sine-wave oscillator made up of the digitally-controlled active RC integrators.

17 Claims, 3 Drawing Sheets

DIGITALLY CONTROLLED TUNER CIRCUIT

This application claims the benefit of the U.S. Provisional Patent Application Ser. No. 60,041,181, filed Mar. 21, 1997.

BACKGROUND OF THE INVENTION

The present invention relates in general to integrated circuit, and in particular to a digitally controlled tuner circuit for continuous-time filters.

To implement a continuous-time filter, various techniques are available. One widely used approach employs well-known transconductance-capacitor (or gm-C) techniques, while another approach relies on the resistor-MOS transistor-capacitor (RMC) architecture. A typical tuner-assisted continuous-time filter implemented using either of these two approaches is subject to increased distortion and degraded noise performance due to the presence of non-linear devices such as transconductance elements in the $g_m$-C architecture or current steering MOS devices in the RMC architecture. Another method of implementing a continuous-time filter is based on the active RC (RCA) type architecture. Active RC filters are known to have good harmonic performance that is mainly limited by the performance of the operational amplifier (opamp). The noise performance of the RCA filter is also limited mainly by the opamp and the choice of resistor values. The main performance problem with the RCA type filters, however, is the variation of their frequency response due to the variations in fabrication process and temperature. The unity-gain frequency of an (RCA) integrator can change by e.g., −30% to +59% when the resistor value changes by ±30% and the capacitor value by ±10%.

There is a need for continuous-time filters with improved performance over process and temperature variations.

SUMMARY OF THE INVENTION

The present invention provides digitally-controlled integrators to implement a PLL-based tuner for use in continuous-time filters. According to a preferred embodiment of the present invention, the value of the feedback capacitors in the integrator can be digitally adjusted which allows the user to compensate for time constant variations in the integrator.

Accordingly, in one embodiment, the present invention provides a digitally-controlled tuner circuit which includes a digitally-controlled oscillator, a comparator coupled to the digitally-controlled oscillator, a phase detector having a first input coupled to an output of the comparator and a second input coupled to receive a reference clock signal, a counter coupled to the phase detector, and a digital filter having an input coupled to an output of the counter, and an output coupled to the digitally-controlled oscillator, wherein, a frequency output of the digitally-controlled oscillator is adjusted in response to the output of the digital filter. In a preferred embodiment, the digitally-controlled oscillator of the present invention is a quadrature sine-wave oscillator implemented by digitally-controlled active RC integrators.

In another embodiment, the present invention provides a digitally-tunable active RC filter which includes a digitally-controlled tuner circuit having a plurality of digital outputs, and a filter having a plurality of active RC type integrators, wherein each integrator is made up of digitally-controlled feedback capacitors with values adjusted in response to the plurality of digital outputs of the digitally-controlled tuner circuit.

A better understanding of the nature and advantages of the present invention may be gained by reference to the drawings and the detailed description below.

DESCRIPTION OF THE PREFERRED EMBODIMENT

Figure 1:
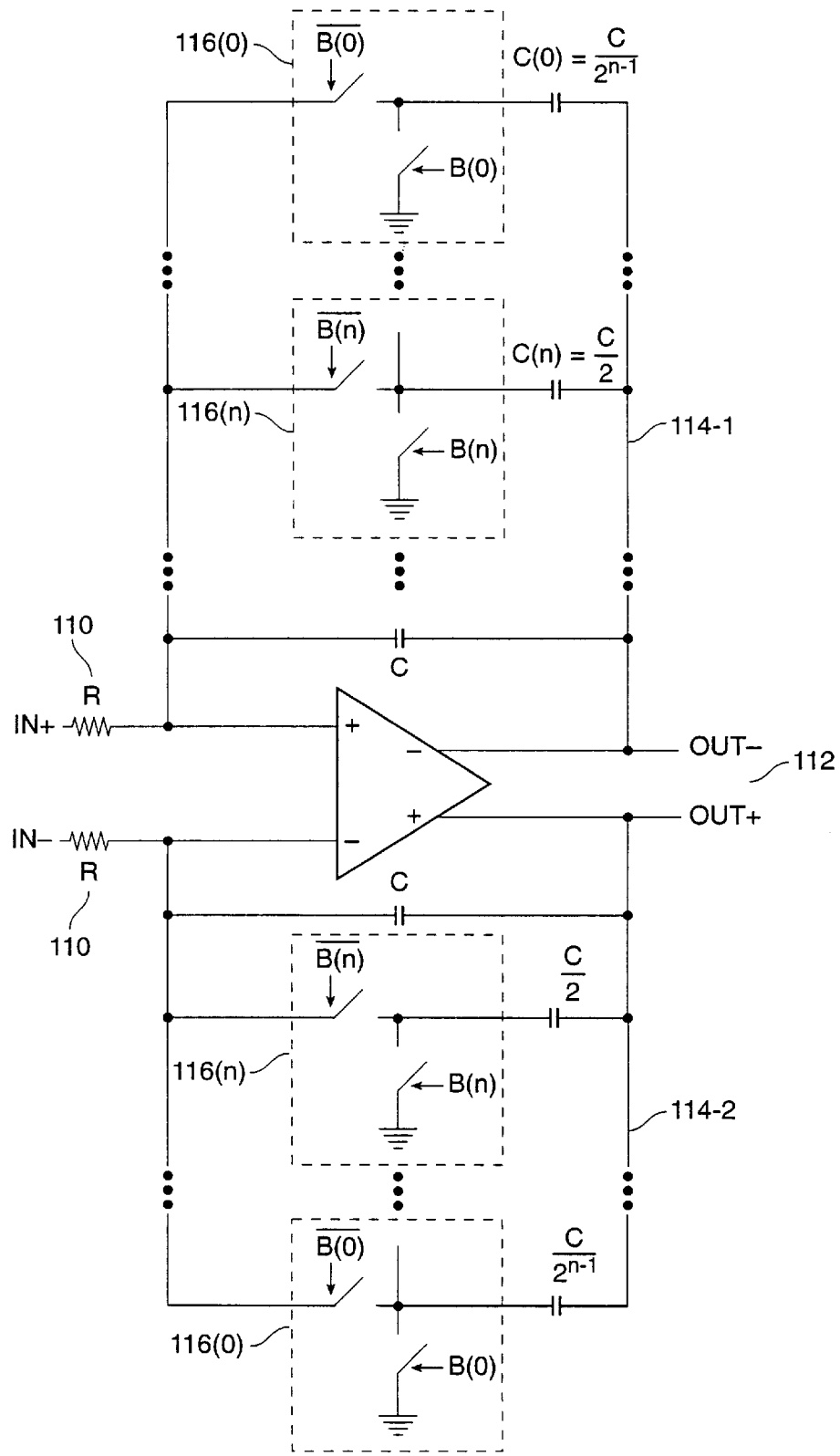
FIG. 1 is a simplified circuit schematic of an RCA integrator with digitally-controlled binary weighted feedback capacitors according to an exemplary embodiment of the present invention.

According to this invention, digitally-controlled active RC integrators employ programmable feedback capacitors that are arranged in binary-weighted arrays. Digitally controlled switches connect to individual capacitors such that the total value of each feedback capacitor can be digitally programmed. A fully differential RCA integrator according to an exemplary embodiment of the present invention is shown in FIG. 1. Resistors 110 on one side connect to the differential input source IN+ and IN−, while from the other side they connect to the inputs of a differential operational amplifier (opamp) 112. Two binary-weighted capacitor arrays 114-1 and 114-2 connect between inputs IN+, IN− and outputs OUT− and OUT+ of the opamp, respectively. Each binary-weighted capacitor array includes a fixed capacitor C that has (n+1) programmable capacitors C(0) to C(n) programmably coupled in parallel thereto. Each programmable capacitor connects to a pair of switches 116 that either connect it in parallel with C or connect it to ground. Programmable capacitor C(0) has a value equal to $[C/2^{n-1}]$, and its switches 116(0) are controlled by the digital signal B(0) and its complement. Programmable capacitor C(n) has a value equal to C/2 and its switches 116(n) are controlled by the digital signal B(n) and its complement. Each capacitor array is thus binary weighted and digitally controlled.

A controller supplying the digital signals B(0) to B(n) can thus fine tune the value of the total feedback capacitor and adjust the time constant of the integrator. In a preferred embodiment, the switches are implemented by MOS transistors and the opamp is a wide-bandwidth opamp with a two-(dominant)pole architecture of the type described in detail in commonly-owned patent application Ser. No. 08/822,988, U.S. Pat. No. 5,880,634, titled "Wide Band-Width Operational Amplifier," by Babanezhad et al., which is hereby incorporated by reference in its entirety for all purposes.

Figure 2:
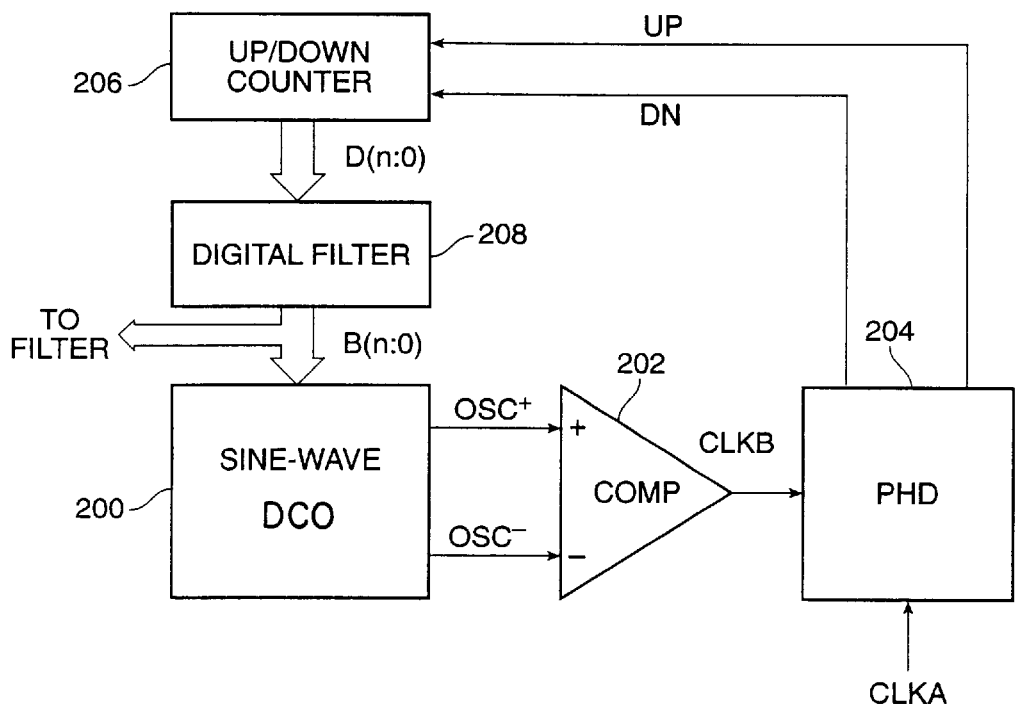
FIG. 2 shows a simplified block diagram of a digitally-controlled RCA tuner circuit according to one embodiment of the present invention.

In one embodiment of the present invention, digitally-controlled RCA integrators such as the one shown in FIG. 1 are used to implement a tuner-assisted RCA continuous-time filter. Referring to FIG. 2, there is shown a phase-locked loop (PLL)-based tuner circuit according to this embodiment of the present invention. The tuner circuit includes a sine-wave digitally-controlled oscillator (DCO) 200 that is implemented by RCA integrators of the type shown in FIG. 1. The outputs of DCO 200 connect to the inputs of a differential comparator 202. Comparator 202 converts a differential sine-wave at its inputs into a square wave at its outputs, and feeds the signal to a phase comparator 204 that compares the phase difference between the output of the comparator and a reference square-wave CLKA. Phase detector 204 provides at its outputs UP and DN pulses that control a digital up/down counter 206. The output of the counter D(n:0) after passing through a digital filter 208 provides the digital control signal B(n:0) for the RCA integrators used inside sine-wave DCO 200. In a preferred embodiment, digital filter 208 is a first-order bilinear digital filter. The same digital control signals B(n:0) also connect to and tune the digitally tuned RCA integrators inside the main filter.

Figure 3:
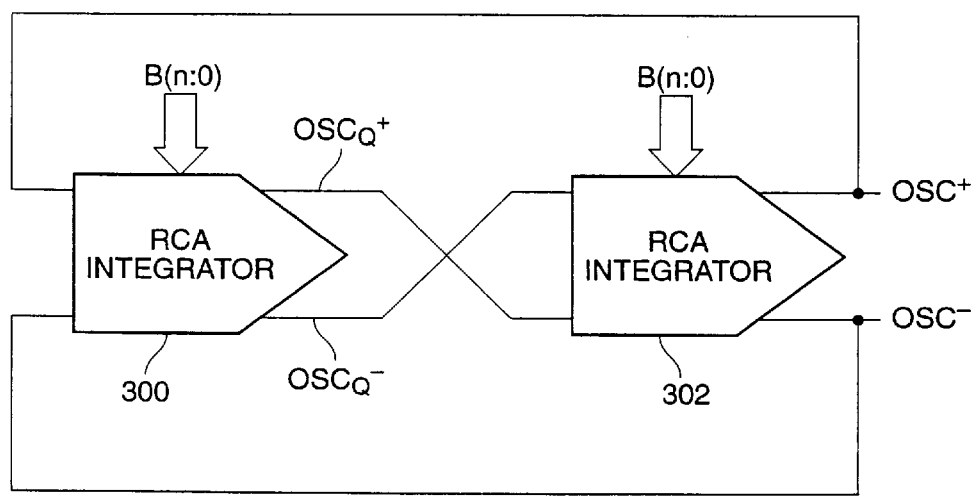
FIG. 3 is a block diagram of an exemplary digitally-controlled oscillator for the tuner circuit of FIG. 2.

The tuner circuit as depicted in FIG. 2 constitutes a second order phase-locked loop (PLL) where the zero of the first order digital loop filter 208 is used to stabilize the PLL. In a preferred embodiment, quadrature sine-wave DCO 200 is synthesized using two RCA integrators of the type shown in FIG. 1. FIG. 3 shows a quadrature sine-wave DCO including a first digitallytunable RCA integrator 300 coupled to a second digitally-tunable RCA integrator 302. Each integrator receives digital control signals B(n:0) to adjust the value of the feedback capacitors and thus the time constant of each integrator. Note that the differential outputs of integrator 300 (OSCQ+ and OSCQ−) connect to the differential inputs of integrator 302 in a cross-coupled fashion, while there is a direct one-to-one coupling between the differential outputs of integrator 302 and the differential inputs of integrator 300.

Figure 4:
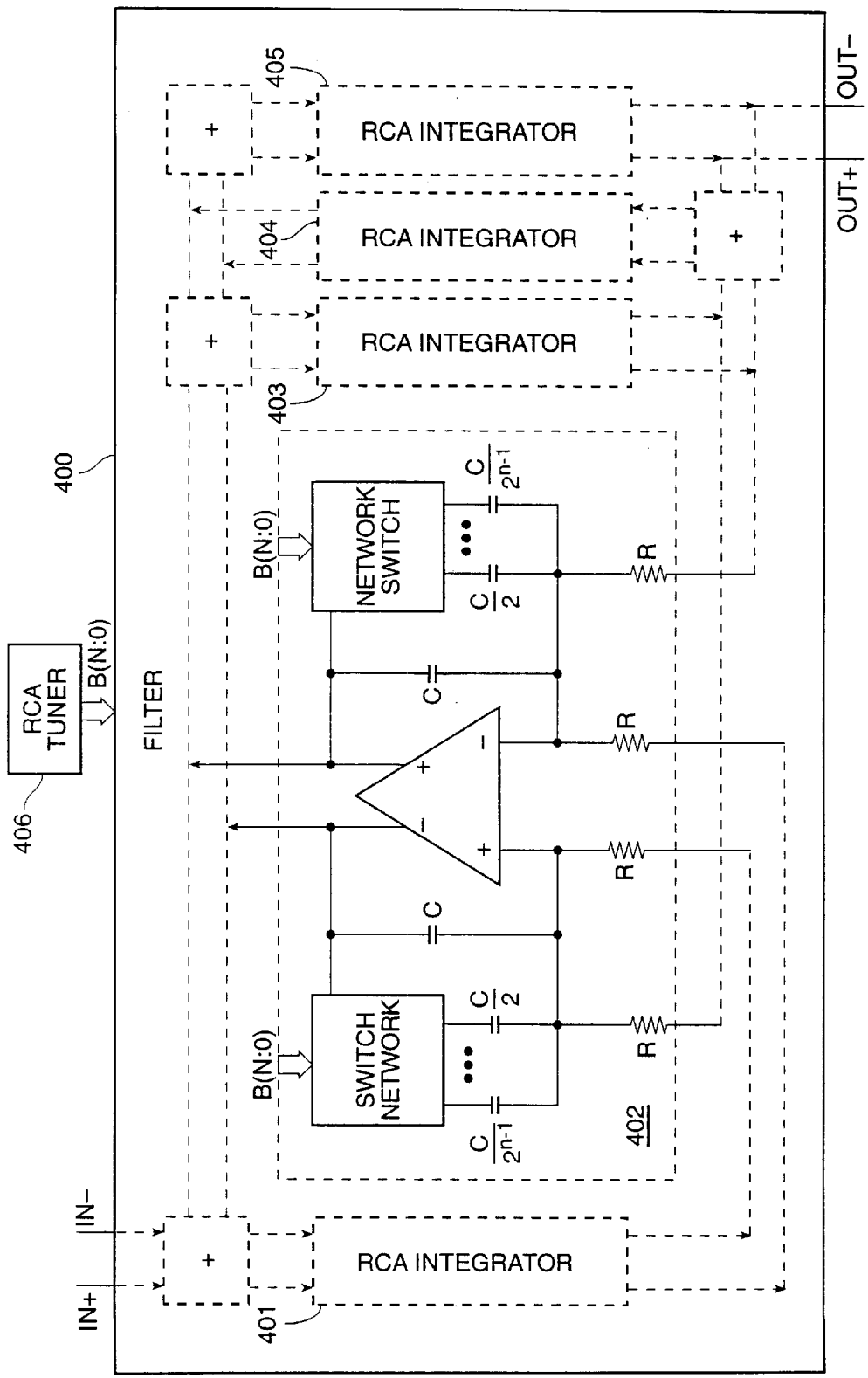
FIG. 4 shows an exemplary digitally-tuned continuous-time filter implemented by the digitally-controlled RCA integrators of the present invention.

FIG. 4 illustrates how the various circuit techniques of the present invention can be advantageously employed to implement an exemplary continuous-time RCA filter 400. Filter 400 is an equivalent of an LC ladder filter that is synthesized by several digitally-tunable RCA integrators according to the present invention. The exemplary RCA filter shown in FIG. 4 includes five digitally-controlled RCA integrators 401, 402, 403, 404, and 405 that are connected back to back as shown. Except for the first and last integrators 401 and 405, the remaining integrators are each driven by two adjacent integrators. In addition to the integrating function, each integrator in this configuration performs the function of summing its two input signals. The implementation of this summing function is shown in the case of integrator 402. The source and load termination resistors of the LC ladder filter are modeled by the first and last integrators 401 and 405 by adding feedback resistors in addition to the feedback capacitors. An RCA tuner circuit 406, an exemplary implementation of which is shown in FIG. 2, supplies the digital control signals B(n:0) to tune the time constant of the various integrators inside filter 400 and thus tune the overall frequency response of filter 400.

The main advantages of a digitally-controlled, tuner assisted continuous-time RCA filter such as the one shown in FIG. 4, compared to other types of common continuous-time filters, are lower harmonic and noise for the filter while achieving 1% to 2% frequency response accuracy. The digital tuning capability allows for the system to compensate for variations in process and temperature. A further advantage of this filter is the relatively small size of its tuner circuit. Often times a big area is taken by the on-chip loop-filter components, and in particular the loop-filter capacitance. But in the preferred embodiment of the present loop-filter 208 is a first order digital filter that requires much less circuit area to implement.

In conclusion, the present invention provides a digitally controlled tuner circuit for continuous-time filters. Active RC integrators include digitally programmable feedback capacitors to allow for digital fine tuning of their time constant. The PLL-based tuner circuit includes a sine-wave oscillator made up of the digitally-controlled active RC integrators. While the above provides a complete description of several specific embodiments of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A digitally-controlled tuner circuit comprising:
 a digitally-controlled oscillator having an input coupled to receive a digital control signal;
 a square-wave generator coupled to said digitally-controlled oscillator;
 a phase detector having a first input coupled to an output of said square-wave generator and a second input coupled to receive a reference clock signal;
 a counter coupled to said phase detector; and
 a digital filter having an input coupled to an output of said counter, and an output coupled to said input of said digitally-controlled oscillator,
 wherein, a frequency output of said digitally-controlled oscillator is adjusted in response to said digital control signal being generated at said output of said digital filter, and
 wherein, said output of said digital filter also provides an output of the tuner circuit.

2. The digitally-controlled tuner circuit of claim 1 wherein said digitally-controlled oscillator comprises a quadrature sine-wave oscillator implemented by digitally-controlled integrators.

3. The digitally-controlled tuner circuit of claim 2 wherein said digitally-controlled oscillator comprises:
 a first digitally-controlled integrator having a pair of differential inputs and a pair of differential outputs; and
 a second digitally-controlled integrator having a pair of differential inputs cross-coupled to said pair of differential outputs of said first digitally-controlled integrator, said second digitally-controlled integrator further having a pair of differential outputs coupled to said differential pair of inputs of said first digitally-controlled integrator.

4. The digitally-controlled tuner circuit of claim 3 wherein each of said first and second digitally-controlled integrators are of an active RC type, comprising:
 a differential operational amplifier;
 a pair of resistors respectively coupled between a pair of differential inputs of the integrator and a pair of differential inputs of said differential operational amplifier; and
 a pair of programmable feedback capacitors respectively coupled between said pair of differential inputs of said differential operational amplifier and a pair of differential outputs of said differential operational amplifier.

5. The digitally-controlled tuner circuit of claim 4 wherein each of said programmable feedback capacitors comprises:
 a fixed capacitor coupled in feedback around said differential operational amplifier; and
 a plurality of programmable capacitors coupled in parallel to said fixed capacitor via a digitally-programmable switch network.

6. The digitally-controlled tuner circuit of claim 5 wherein said plurality of programmable capacitors are binary weighted.

7. The digitally-controlled tuner circuit of claim 6 wherein for each one of said plurality of programmable capacitors, said switch network comprises:

a first switch coupling its respective programmable capacitor in parallel to said fixed capacitor in response to a digital signal; and a second switch coupling said respective programmable capacitor to ground in response to a complement of said digital signal.

8. The digitally-controlled tuner circuit of claim 2 wherein the tuner circuit couples to an active RC type filter, and supplies said output of said digital filter to a plurality of digitally-controlled integrators inside said active RC type filter.

9. The digitally-controlled tuner circuit of claim 1 wherein said digital filter comprises a first-order bilinear digital filter.

10. A method digitally controlling a tuner circuit, the method comprising:

providing a digitally-controlled oscillator that generates an output signal with controlled frequency;

converting the output signal of the digitally-controlled oscillator to a square-wave signal;

detecting a phase difference between the square-wave signal and a reference signal;

controlling a counter in response to the detecting step;

digitally filtering an output of the counter to generate a digital control signal; and controlling the frequency of the output signal of the oscillator by applying the digital control signal to the oscillator.

11. The method of claim 10 further comprising a step tuning an active RC type filter using the digital control signal.

12. The method of claim 11 the step of tuning comprises a step of applying the digital control signal to a plurality of digitally controlled integrators inside the active RC type filter.

13. The method of claim 10 wherein the step of controlling the frequency of the output signal of the oscillator comprises digitally varying an amount of feedback capacitance in an integrator inside the oscillator.

14. A digitally-controlled tuner circuit comprising:

a digitally-controlled oscillator having a digitally-controlled integrator with a feedback capacitor whose value is digitally controlled;

a phase detector coupled to the digitally-controlled oscillator;

a counter coupled to the phase detector; and a digital filter coupled between the counter and the digitally-controlled oscillator, with an output supplying the output of the tuner circuit, wherein, the digital filter supplies a digital signal for controlling the feedback capacitor of the integrator in the digitally-controlled oscillator.

15. The digitally-controlled tuner circuit of claim 14 wherein the digitally-controlled oscillator comprises two cross-coupled integrators whose feedback capacitors are digitally controlled.

16. The digitally-controlled tuner circuit of claim 15 wherein each feedback capacitor comprises multiple binary weighted capacitive elements coupled in parallel via a digitally-controlled network of switches.

17. The digitally-controlled tuner circuit of claim 14 wherein the tuner circuit couples to an active RC type filter, and wherein the digital signal at the output of the digital filter is supplied to a plurality of digitally-controlled integrators inside the active RC type filter.

* * * * *